US012301200B2

(12) United States Patent
Malekzadeh et al.

(10) Patent No.: US 12,301,200 B2
(45) Date of Patent: May 13, 2025

(54) BALUN HAVING ASYMMETRIC INDUCTORS AND ADJUSTABLE IMPEDANCE TRANSFORMATION RATIO

(71) Applicant: QUALCOMM INCORPORATED, San Diego, CA (US)

(72) Inventors: Foad Arfaei Malekzadeh, San Diego, CA (US); Jorge Garcia, San Diego, CA (US); Jeremy Darren Dunworth, La Jolla, CA (US)

(73) Assignee: QUALCOMM Incorporated, San Diego, CA (US)

( * ) Notice: Subject to any disclaimer, the term of this patent is extended or adjusted under 35 U.S.C. 154(b) by 321 days.

(21) Appl. No.: 17/951,672

(22) Filed: Sep. 23, 2022

(65) Prior Publication Data

US 2024/0106407 A1 Mar. 28, 2024

(51) Int. Cl.
*H03H 7/42* (2006.01)
*H03H 7/01* (2006.01)
*H03H 7/09* (2006.01)

(52) U.S. Cl.
CPC ............ *H03H 7/42* (2013.01); *H03H 7/0115* (2013.01); *H03H 7/0153* (2013.01); *H03H 7/09* (2013.01)

(58) Field of Classification Search
CPC .......... H03H 7/0115; H03H 7/09; H03H 7/42; H03H 7/38
USPC ................................ 333/4, 5, 175, 177, 185
See application file for complete search history.

(56) References Cited

U.S. PATENT DOCUMENTS

| | | | | |
|---|---|---|---|---|
| 6,952,142 B2* | 10/2005 | Guitton | ................... | H03H 7/422 |
| | | | | 333/25 |
| 10,784,636 B1* | 9/2020 | Vigilante | ................. | H04B 1/40 |
| 2005/0264273 A1 | 12/2005 | Ezzedine | | |
| 2009/0167455 A1 | 7/2009 | Liu et al. | | |
| 2011/0181990 A1* | 7/2011 | Huang | ................... | H02H 9/046 |
| | | | | 361/56 |
| 2014/0266506 A1 | 9/2014 | Andersson et al. | | |
| 2015/0070242 A1* | 3/2015 | Kawai | ....................... | H03F 3/24 |
| | | | | 333/177 |
| 2019/0222183 A1 | 7/2019 | Kwok | | |
| 2022/0182079 A1 | 6/2022 | Muharemovic et al. | | |

OTHER PUBLICATIONS

Deb P.K., et al., "Miniaturized and Enhanced Bandwidth Marchand Balun Using CSRR", IET Microwaves, Antennas& Propagation, the Institution of Engineering and Technology, United Kingdom, vol. 15, No. 7, Mar. 30, 2021, pp. 788-796, XP006108505, figure 6.

(Continued)

*Primary Examiner* — Rakesh B Patel
(74) *Attorney, Agent, or Firm* — Smith Tempel Blaha LLC/Qualcomm Incorporated

(57) ABSTRACT

A balun circuit includes a first transformer comprising a first inductor and a second inductor, the first inductor having an electrical value different than the second inductor, a second transformer comprising a third inductor and a fourth inductor, the third inductor having an electrical value different than the fourth inductor, the first inductor connected to a positive terminal of a balanced port, the third inductor connected to a negative terminal of the balanced port, the second inductor connected to an unbalanced port and the fourth inductor connected to a node.

23 Claims, 10 Drawing Sheets

(56) References Cited

OTHER PUBLICATIONS

Partial International Search Report—PCT/US2023/032703—ISA/EPO—Jan. 10, 2024.
Rotella F.M., et al., "Characterization, Design, Modeling, and Model Validation of Silicon on-Wafer M:N Balun Components Under Matched and Unmatched Conditions", IEEE Journal of Solid-state Circuits, vol. 41, No. 5, May 1, 2006, pp. 1201-1209, XP093112442, figures 1, 3, 5, 6, 7.
International Search Report and Written Opinion—PCT/US2023/032703—ISA/EPO—May 14, 2024.
Ang K.S., et al., "Analysis and Design of Miniaturized Lumped-Distributed Impedance-Transforming Baluns," in IEEE Transactions on Microwave Theory and Techniques, vol. 51, No. 3, Mar. 2003, pp. 1009-1017, DOI:10.1109/TMTT.2003.808677.
Tang C-W., et al., "A Semi-Lumped Balun Fabricated by Low Temperature Co-Fired Ceramic", 2002 IEEE MTT-S International Microwave Symposium Digest (Cat. No. 02CH37278), 2002, pp. 2201-2204, vol. 3, DOI: 10.1109/MWSYM.2002.1012309.

\* cited by examiner

BALUN HAVING ASYMMETRIC INDUCTORS AND ADJUSTABLE IMPEDANCE TRANSFORMATION RATIO

FIELD

The present disclosure relates generally to electronics, and more specifically to baluns used in transceivers.

BACKGROUND

Wireless communication devices and technologies are becoming ever more prevalent, as are communication devices that operate at millimeter-wave (mmW) frequencies. Wireless communication devices generally transmit and/or receive communication signals. In a radio frequency (RF) transceiver, a communication signal is typically amplified and transmitted by a transmit section and a received communication signal is amplified and processed by a receive section. A transceiver for communication in mmW frequencies such as are used in some 5G and 6G applications generally uses what is referred to as a super heterodyne architecture. A super heterodyne architecture is one where in the transmit mode a baseband information signal is upconverted to an intermediate frequency (IF) before being further upconverted to a radio frequency (RF) signal for transmission. In the receive mode of a super heterodyne architecture the RF signal is first downconverted to an IF before being further downconverted to baseband. One of the components used in such a transceiver is referred to as a balun. The term balun is used because a balun converts a balanced signal (such as a differential signal) to an unbalanced signal (such as a single-ended signal) and vice versa.

In some implementations, the IF fractional bandwidth used in 5G and 6G applications may be as small as about 1 percent and as much as over 30 percent or more. It is challenging to combine high impedance ratios and at the same time perform balanced to unbalanced signal transformation with wide bandwidth in a single element. Traditional transformers cannot achieve sufficiently wide bandwidth while providing the desired impedance transformation ratios.

SUMMARY

Various implementations of systems, methods and devices within the scope of the appended claims each have several aspects, no single one of which is solely responsible for the desirable attributes described herein. Without limiting the scope of the appended claims, some prominent features are described herein.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

One aspect of the disclosure provides a balun circuit, comprising a first transformer comprising a first inductor and a second inductor, the first inductor having an electrical value different than the second inductor, a second transformer comprising a third inductor and a fourth inductor, the third inductor having an electrical value different than the fourth inductor, the first inductor connected to a positive terminal of a balanced port, the third inductor connected to a negative terminal of the balanced port, the second inductor connected to an unbalanced port and the fourth inductor connected to a node, a first capacitance (Cbp) connected across the first inductor, and a second capacitance connected across the third inductor.

Another aspect of the disclosure provides a method for signal conversion comprising adjusting an impedance transformation ratio (ITR) of a balun circuit by selecting inductor values, adjusting the impedance transformation ratio (ITR) of the balun circuit by selecting capacitance values; and converting a signal between balanced and unbalanced.

Another aspect of the disclosure provides a balun circuit comprising a pair of asymmetric transformers coupled together, wherein inductors on an unbalanced side of the asymmetric transformers have approximately equal inductance.

BRIEF DESCRIPTION OF THE DRAWINGS

In the figures, like reference numerals refer to like parts throughout the various views unless otherwise indicated. For reference numerals with letter character designations such as "102a" or "102b", the letter character designations may differentiate two like parts or elements present in the same figure. Letter character designations for reference numerals may be omitted when it is intended that a reference numeral encompass all parts having the same reference numeral in all figures.

DETAILED DESCRIPTION

Figure 1:
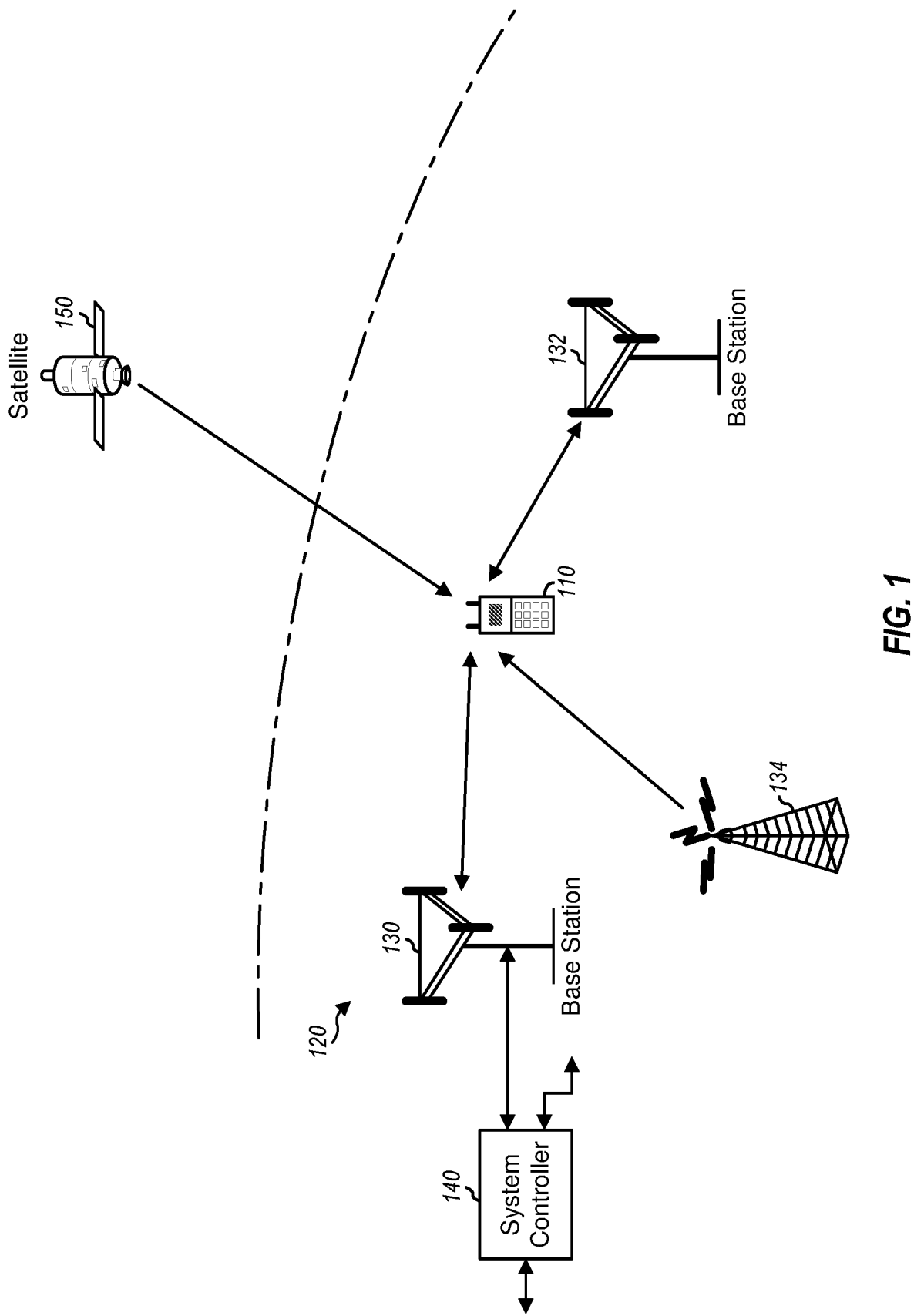
FIG. 1 is a diagram showing a wireless device communicating with a wireless communication system.

The word "exemplary" is used herein to mean "serving as an example, instance, or illustration." Any aspect described herein as "exemplary" is not necessarily to be construed as preferred or advantageous over other aspects.

In a communication device transceiver, one or more baluns or balun circuits may be used for signal processing before and/or after various other signal processing circuitry.

A balun in accordance with exemplary embodiments can be used to convert a single ended signal at an antenna or another port to a differential signal compatible with on-chip differential circuitry and vice versa.

A balun in accordance with exemplary embodiments can be used in a receiver to provide impedance matching to optimize receiver noise figure (NF) with wide bandwidth.

A balun in accordance with exemplary embodiments can be used in a receiver to provide matching to the intermediate frequency (IF) port of a down conversion mixer, which typically has an output impedance higher than 50 ohm, which makes it difficult to match and convert a differential signal to a single ended signal on a transmission line (TL) with sufficient bandwidth and low loss.

A balun in accordance with exemplary embodiments can be used in a transmitter, such as after a power amplifier (PA). For example, the impedance of the antenna will likely vary which could damage the PA. A balun in accordance with exemplary embodiments can provide variable impedance to protect the power amplifier.

A balun in accordance with exemplary embodiments can be used in an impedance agnostic application so that despite unpredictable parasitics, gain is not compromised.

In an exemplary embodiment, a balun having asymmetric inductors and adjustable impedance transformation ratio can provide high impedance ratios and perform balanced to unbalanced signal transformation with wide bandwidth in a single functional element.

In an exemplary embodiment, a balun having asymmetric inductors and adjustable impedance transformation ratio can provide a variable or tunable impedance transformation ratio (ITR).

In an exemplary embodiment, a balun having asymmetric inductors and adjustable impedance transformation ratio (ITR) can be implemented using small circuit area.

In an exemplary embodiment, a balun having asymmetric inductors and adjustable impedance transformation ratio (ITR) can provide an adjustable impedance transformation ratio over a wide range using capacitive tuning.

In an exemplary embodiment, a balun having asymmetric inductors and adjustable impedance transformation ratio can provide electrostatic discharge (ESD) protection for IF frequencies ranging up to approximately 30 GHz, using ESD protection diodes to provide a portion of total capacitance in a wideband balun.

A balun may be implemented using one or more inductive elements, such as inductors, and may be configured as a transformer. A balun may also provide impedance transformation, generally in systems where an unbalanced impedance of, for example 50 or 75 ohms, is coupled to a balanced impedance of, for example 200 or 300 ohms. Using an inductive balun to allow an RF amplifier to provide multiple band or high bandwidth operation generally causes degradation in the balun Q (quality factor) and adds complexity and cost due to the additional switches used for the balun configuration. Exemplary embodiments of the balun described herein may minimize degradation in the balun Q (quality factor) and minimize the complexity and cost of a balun.

As used herein, the term "adjustable impedance transformation ratio" refers to adjusting an impedance transformation ratio of a balun either during the device design phase, during device manufacture or calibration, or dynamically during device operation.

As used herein, the term "tunable" refers to dynamically changing a component value during device operation.

As used herein, the term "variable" refers to selecting a component value during device design, manufacture, or calibration.

FIG. 1 is a diagram showing a wireless device 110 communicating with a wireless communication system 120. The wireless communication system 120 may be a Long Term Evolution (LTE) system, a Code Division Multiple Access (CDMA) system, a Global System for Mobile Communications (GSM) system, a wireless local area network (WLAN) system, a 5G NR (new radio) system, or some other wireless system. A CDMA system may implement Wideband CDMA (WCDMA), CDMA 1x, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless communication system may include any number of base stations and any set of network entities.

The wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a tablet, a cordless phone, a medical device, an automobile, a device configured to connect to one or more other devices (for example through the internet of things), a wireless local loop (WLL) station, a Bluetooth device, etc. Wireless device 110 may communicate with wireless communication system 120. Wireless device 110 may also receive signals from broadcast stations (e.g., a broadcast station 134) and/or signals from satellites (e.g., a satellite 150 in one or more global navigation satellite systems (GNSS)), etc.). Wireless device 110 may support one or more radio technologies for wireless communication such as LTE, WCDMA, CDMA 1x, EVDO, TD-SCDMA, GSM, 802.11, 802.15, 5G, Sub6 5G, 6G, UWB, etc.

Wireless device 110 may support carrier aggregation, for example as described in one or more LTE or 5G standards. In some embodiments, a single stream of data is transmitted over multiple carriers using carrier aggregation, for example as opposed to separate carriers being used for respective data streams. Wireless device 110 may be able to operate in a variety of communication bands including, for example, those communication bands used by LTE, WiFi, 5G or other communication bands, over a wide range of frequencies. Wireless device 110 may also be capable of communicating directly with other wireless devices without communicating through a network.

In general, carrier aggregation (CA) may be categorized into two types—intra-band CA and inter-band CA. Intra-band CA refers to operation on multiple carriers within the same band. Inter-band CA refers to operation on multiple carriers in different bands.

Figure 2A:
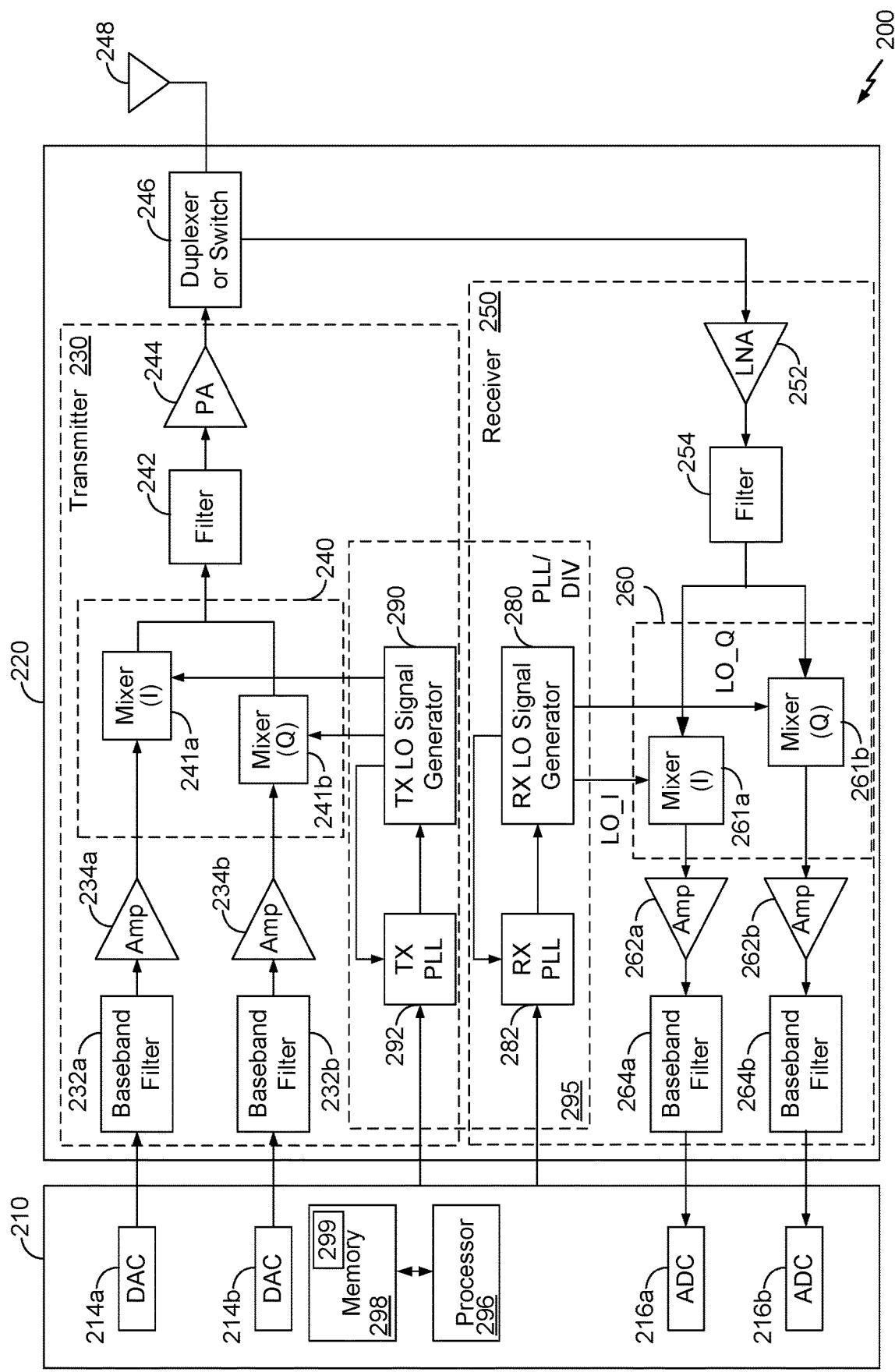
FIG. 2A is a block diagram showing a wireless device in which exemplary techniques of the present disclosure may be implemented.

FIG. 2A is a block diagram showing a wireless device 200 in which the exemplary techniques of the present disclosure may be implemented. The wireless device 200 may, for example, be an embodiment of the wireless device 110 illustrated in FIG. 1.

FIG. 2A shows an example of a transceiver 220 having a transmitter 230 and a receiver 250. In general, the conditioning of the signals in the transmitter 230 and the receiver 250 may be performed by one or more stages of amplifier, filter, upconverter, downconverter, etc. These circuit blocks may be arranged differently from the configuration shown in FIG. 2A. Furthermore, other circuit blocks not shown in FIG. 2A may also be used to condition the signals in the transmitter 230 and receiver 250, for example phase shifters as discussed further below. Unless otherwise noted, any signal in FIG. 2A, or any other figure in the drawings, may be either single-ended or differential. Some circuit blocks in FIG. 2A may also be omitted.

In the example shown in FIG. 2A, wireless device 200 generally comprises the transceiver 220 and a data processor 210. The data processor 210 may include a processor 296 operatively coupled to a memory 298. The memory 298 may be configured to store data and program codes shown generally using reference numeral 299, and may generally comprise analog and/or digital processing components. The transceiver 220 includes a transmitter 230 and a receiver 250 that support bi-directional communication. In general, wireless device 200 may include any number of transmitters and/or receivers for any number of communication systems and frequency bands. All or a portion of the transceiver 220 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency-converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the example shown in FIG. 2A, transmitter 230 and receiver 250 are implemented with the direct-conversion architecture.

In the transmit path, the data processor 210 processes data to be transmitted and provides in-phase (I) and quadrature (Q) analog output signals to the transmitter 230. In an exemplary embodiment, the data processor 210 includes digital-to-analog-converters (DAC's) 214a and 214b for converting digital signals generated by the data processor 210 into the I and Q analog output signals, e.g., I and Q output currents, for further processing. In other embodiments, the DACs 214a and 214b are included in the transceiver 220 and the data processor 210 provides data (e.g., for I and Q) to the transceiver 220 digitally.

Within the transmitter 230, lowpass filters 232a and 232b filter the I and Q analog transmit signals, respectively, to remove undesired images caused by the prior digital-to-analog conversion Amplifiers (Amp) 234a and 234b amplify the signals from lowpass filters 232a and 232b, respectively, and provide I and Q baseband signals. An upconverter 240 having upconversion mixers 241a and 241b upconverts the I and Q baseband signals with I and Q transmit (TX) local oscillator (LO) signals from a TX LO signal generator 290 and provides an upconverted signal. A filter 242 filters the upconverted signal to remove undesired images caused by the frequency upconversion as well as noise in a receive frequency band. A power amplifier (PA) 244 amplifies the signal from filter 242 to obtain the desired output power level and provides a transmit RF signal. The transmit RF signal is routed through a duplexer or switch 246 and transmitted via an antenna 248, or alternatively it can be sent to a separate transmit antenna different from a separate receive antenna. While examples discussed herein utilize I and Q signals, those of skill in the art will understand that components of the transceiver may be configured to utilize polar modulation.

In the receive path, antenna 248 receives communication signals and provides a received RF signal, which can be routed through duplexer or switch 246 and provided to a low noise amplifier (LNA) 252. The duplexer 246 is designed to operate with a specific RX-to-TX duplexer frequency separation, such that RX signals are isolated from TX signals. Alternatively, there may be a separate transmit antenna and separate receive antenna as mentioned above, in which case RX-to-TX isolation can be achieved through the limited coupling between the two antennas. In the case of separate RX and TX antennas, the RX antenna can be coupled directly to LNA 252. The received RF signal is amplified by LNA 252 and filtered by a filter 254 to obtain a desired RF input signal. Downconversion mixers 261a and 261b in a downconverter 260 mix the output of filter 254 with I and Q receive (RX) LO signals (i.e., LO_I and LO_Q) from an RX LO signal generator 280 to generate I and Q baseband signals. The I and Q baseband signals are amplified by amplifiers 262a and 262b and further filtered by lowpass filters 264a and 264b to obtain I and Q analog input signals, which are provided to data processor 210. In the exemplary embodiment shown, the data processor 210 includes analog-to-digital-converters (ADC's) 216a and 216b for converting the analog input signals into digital signals to be further processed by the data processor 210. In some embodiments, the ADCs 216a and 216b are included in the transceiver 220 and provide data to the data processor 210 digitally.

In FIG. 2A, TX LO signal generator 290 generates the I and Q TX LO signals used for frequency upconversion, while RX LO signal generator 280 generates the I and Q RX LO signals used for frequency downconversion. Each LO signal is a periodic signal with a particular fundamental frequency. A phase locked loop (PLL) 292 receives timing information from data processor 210 and generates a control signal used to adjust the frequency and/or phase of the TX LO signals from LO signal generator 290. Similarly, a PLL 282 receives timing information from data processor 210 and generates a control signal used to adjust the frequency and/or phase of the RX LO signals from LO signal generator 280.

In an exemplary embodiment, the RX PLL 282, the TX PLL 292, the RX LO signal generator 280, and the TX LO signal generator 290 may alternatively be combined into a single LO generator circuit 295, which may include common or shared LO signal generator circuitry to provide the TX LO signals and the RX LO signals. Alternatively, separate LO generator circuits may be used to generate the TX LO signals and the RX LO signals.

Wireless device 200 may support CA and may (i) receive multiple downlink signals transmitted by one or more cells on multiple downlink carriers at different frequencies and/or (ii) transmit multiple uplink signals to one or more cells on multiple uplink carriers. Those of skill in the art will understand, however, that aspects described herein may be implemented in systems, devices, and/or architectures that do not support carrier aggregation.

Certain components of the transceiver 220 are functionally illustrated in FIG. 2A, and the configuration illustrated therein may or may not be representative of a physical device configuration in certain implementations. For example, as described above, transceiver 220 may be implemented in various integrated circuits (ICs), RF ICs (RFICs), mixed-signal ICs, etc. In some embodiments, the transceiver 220 is implemented on a substrate or board such as a printed circuit board (PCB) having various modules, chips, and/or components. For example, the power amplifier 244, the filter 242, and the duplexer 246 may be implemented in separate modules or as discrete components, while the remaining components illustrated in the transceiver 220 may be implemented in a single transceiver chip.

The power amplifier 244 may comprise one or more stages comprising, for example, driver stages, power amplifier stages, or other components, that can be configured to amplify a communication signal on one or more frequencies, in one or more frequency bands, and at one or more power levels. Depending on various factors, the power amplifier 244 can be configured to operate using one or more driver stages, one or more power amplifier stages, one or more impedance matching networks, and can be configured to provide good linearity, efficiency, or a combination of good linearity and efficiency.

In an exemplary embodiment in a super-heterodyne architecture, the filter 242, PA 244, LNA 252 and filter 254 may be implemented separately from other components in the transmitter 230 and receiver 250, and may be implemented on a millimeter wave integrated circuit. An example super-heterodyne architecture is illustrated in FIG. 2B.

Figure 2B:
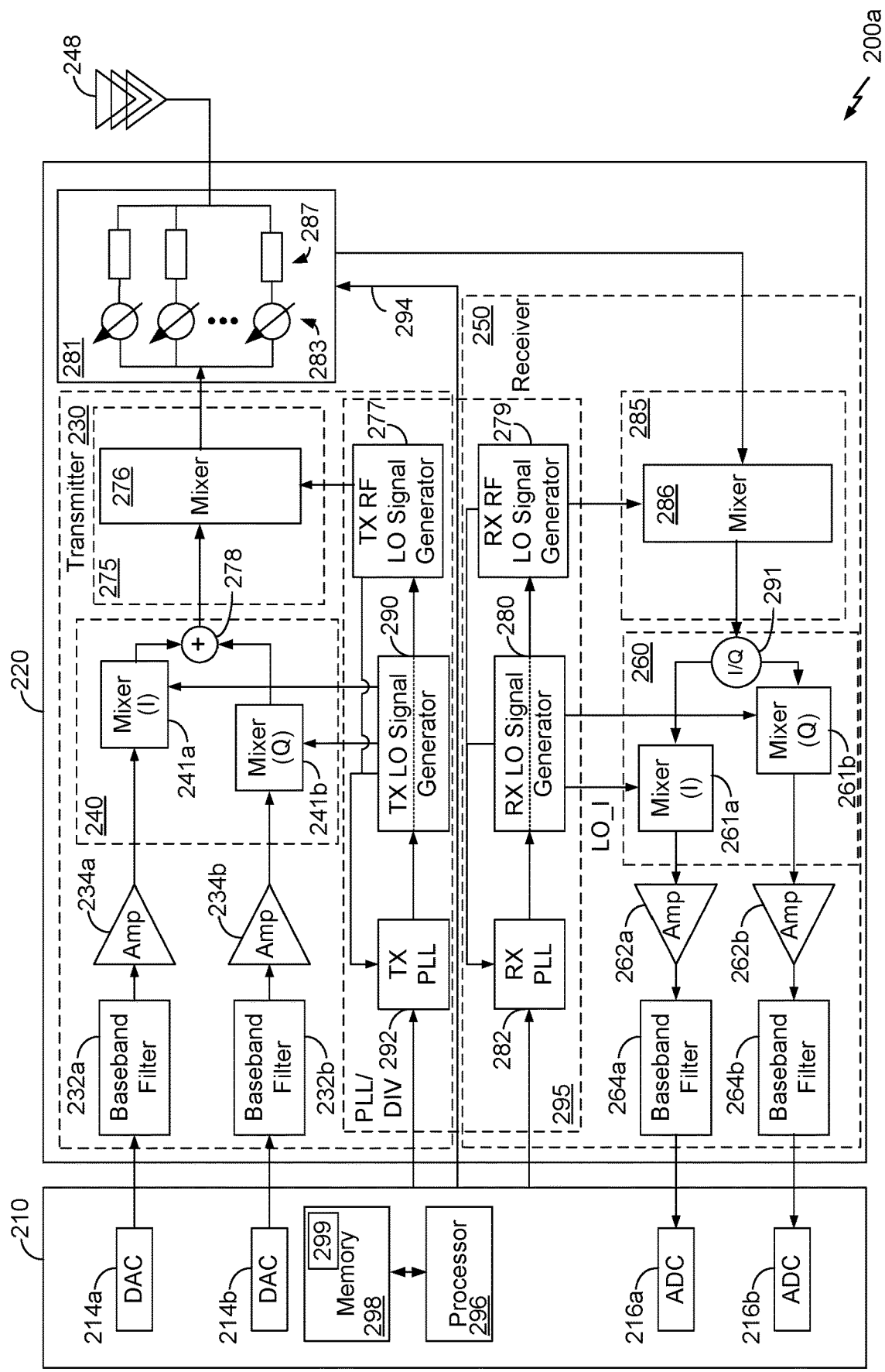
FIG. 2B is a block diagram showing a wireless device in which exemplary techniques of the present disclosure may be implemented.

FIG. 2B is a block diagram showing a wireless device in which the exemplary techniques of the present disclosure may be implemented. Certain components, for example which may be indicated by identical reference numerals, of the wireless device 200a in FIG. 2B may be configured similarly to those in the wireless device 200 shown in FIG. 2A and the description of identically numbered items in FIG. 2B will not be repeated.

The wireless device 200a is an example of a heterodyne (or superheterodyne) architecture in which the upconverter 240 and the downconverter 260 are configured to process a communication signal between baseband and an intermediate frequency (IF). For example, the upconverter 240 may be configured to provide an IF signal to an upconverter 275. In an exemplary embodiment, the upconverter 275 may comprise upconversion mixer 276. The summing function 278 of upconverter 240 combines the I and the Q outputs and provides a combined signal to the mixer 276. The combined signal may be single ended or differential. The mixer 276 is configured to receive the IF signal from the upconverter 240 and TX RF LO signals from a TX RF LO signal generator 277, and provide an upconverted RF signal to phase shift circuitry 281. While PLL 292 is illustrated in FIG. 2B as being shared by the signal generators 290, 277, a respective PLL for each signal generator may be implemented.

In an exemplary embodiment, components in the phase shift circuitry 281 may comprise one or more adjustable or variable phased array elements, and may receive one or more control signals from the data processor 210 over connection 294 and operate the adjustable or variable phased array elements based on the received control signals.

In an exemplary embodiment, the phase shift circuitry 281 comprises phase shifters 283 and phased array elements 287. Although three phase shifters 283 and three phased array elements 287 are shown for ease of illustration, the phase shift circuitry 281 may comprise more or fewer phase shifters 283 and phased array elements 287.

Each phase shifter 283 may be configured to receive the RF transmit signal from the upconverter 275, alter the phase by an amount, and provide the RF signal to a respective phased array element 287. Each phased array element 287 may comprise transmit and receive circuitry including one or more filters, amplifiers, driver amplifiers, and power amplifiers. In some embodiments, the phase shifters 283 may be incorporated within respective phased array elements 287.

The output of the phase shift circuitry 281 is provided to an antenna array 248. In an exemplary embodiment, the antenna array 248 comprises a number of antennas that typically correspond to the number of phase shifters 283 and phased array elements 287, for example such that each antenna element is coupled to a respective phased array element 287. In an exemplary embodiment, the phase shift circuitry 281 and the antenna array 248 may be referred to as a phased array.

In a receive direction, an output of the phase shift circuitry 281 is provided to a downconverter 285. In an exemplary embodiment, the downconverter 285 may comprise a downconversion mixer 286. In an exemplary embodiment, the mixer 286 downconverts the receive RF signal provided by the phase shift circuitry 281 to an IF signal according to RX RF LO signals provided by an RX RF LO signal generator 279. The I/Q generation function 291 of downconverter 260 receives the IF signal from the mixer 286 and generates I and Q signals in downconverter 260, which downconverts the IF signals to baseband, as described above. While PLL 282 is illustrated in FIG. 2B as being shared by the signal generators 280, 279, a respective PLL for each signal generator may be implemented.

In some embodiments, the upconverter 275, downconverter 285, and the phase shift circuitry 281 are implemented on a common IC. In some embodiments, the summing function 278 and the I/Q generation function 291 are implemented separate from the mixers 276 and 286 such that the mixers 276, 286 and the phase shift circuitry 281 are implemented on the common IC, but the summing function 278 and I/Q generation function 291 are not (e.g., the summing function 278 and I/Q generation function 291 are implemented in another IC coupled to the IC having the mixers 276, 286). In some embodiments, the LO signal generators 277, 279 are included in the common IC. In some embodiments in which phase shift circuitry is implemented on a common IC with 276, 286, 277, 278, 279, and/or 291, the common IC and the antenna array 248 are included in a module, which may be coupled to other components of the transceiver 220 via a connector. In some embodiments, the phase shift circuitry 281, for example, a chip on which the phase shift circuitry 281 is implemented, is coupled to the antenna array 248 by an interconnect. For example, components of the antenna array 248 may be implemented on a substrate and coupled to an integrated circuit implementing the phase shift circuitry 281 via a flexible printed circuit or the chip may be mounted on the substrate.

In some embodiments, both the architecture illustrated in FIG. 2A and the architecture illustrated in FIG. 2B are implemented in the same device. For example, a wireless device 110 or 200 may be configured to communicate with signals having a frequency below about 7 GHz (e.g., the FR1 frequency band) using the architecture illustrated in FIG. 2A and to communicate with signals having a frequency above about 24 GHz using the architecture illustrated in FIG. 2B. In devices in which both architectures are implemented, one or more components of FIGS. 2A and 2B that are identically numbered may be shared between the two architectures. For example, both signals that have been downconverted directly to baseband from RF and signals that have been downconverted from RF to baseband via an IF stage may be filtered by the same baseband filter 264. In other embodiments, a first version of the filter 264 is included in the portion of the device which implements the architecture of FIG. 2A and a second version of the filter 264 is included in the portion of the device which implements the architecture of FIG. 2B.

Figure 3:
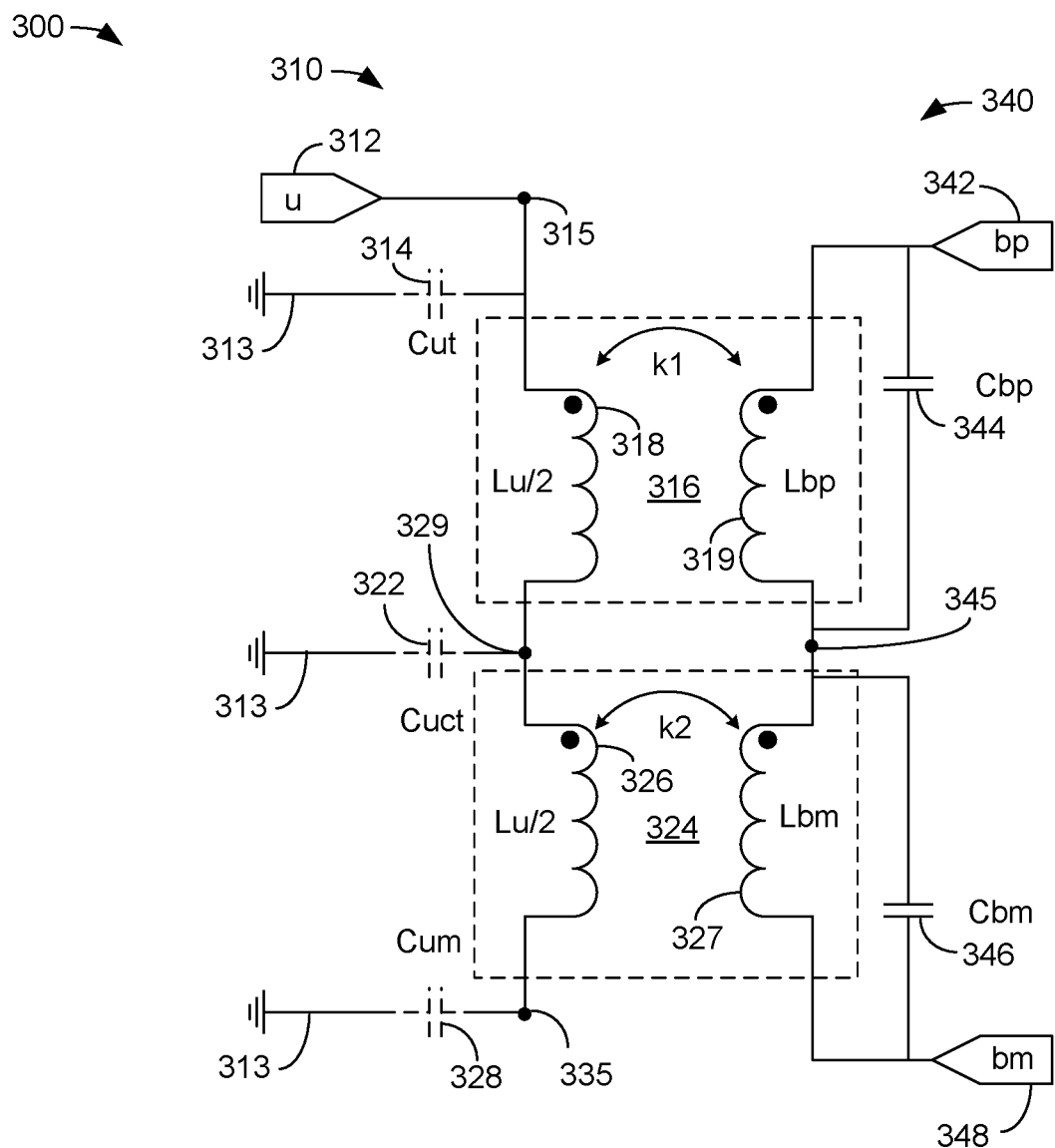
FIG. 3 is a block diagram of a balun circuit in accordance with an exemplary embodiment of the disclosure.

FIG. 3 is a block diagram of a balun circuit 300 in accordance with an exemplary embodiment of the disclosure. In an exemplary embodiment, the balun circuit 300 includes an unbalanced side 310 and a balanced side 340. The unbalanced side 310 is generally connected to a single-ended signal and the balanced side 340 is generally connected to a differential signal. A signal ended signal is one where the electrical signal is carried on one electrical conductor, also called a line or wire, and voltage on the line is referenced to a reference voltage level, generally defined by system ground. A differential signal is one where two lines carry the same electrical signal but at opposite polarity.

In an exemplary embodiment, the unbalanced side 310 includes a terminal or port 312, and a system ground at connection 313. The port 312 is configured to carry a single-ended signal. The balanced side 340 generally includes a terminal or port 342 and a terminal or port 348 configured to carry differential signals. In an exemplary embodiment, the port 342 may be referred to as carrying a positive (p) polarity signal and may be referred to as "bp" and the port 348 may be referred to as carrying a minus (m) polarity signal and may be referred to as "bm", where the polarity of the signal at port 342 is opposite than the polarity of the signal on port 348.

In an exemplary embodiment, the balun circuit also includes a first transformer 316 and a second transformer 324.

In an exemplary embodiment, the first transformer 316 includes a first inductor 319 (Lbp) and a second inductor 318 (Lu/2). In an exemplary embodiment, the second transformer 324 includes a third inductor 327 (Lbm) and a fourth inductor 326 (Lu/2). The exemplary value of the first inductor 319 (Lbp) and the third inductor 327 (Lbm) refers to the inductance of the balanced side 340. The exemplary value of the second inductor 318 (Lu/2) and the fourth inductor 326 (Lu/2) refers to the inductance of the unbalanced side 310, where the total inductance of the second inductor 318 (Lu/2) and the fourth inductor 326 (Lu/2) is Lu. For example, in an exemplary embodiment, the total inductance of the second inductor 318 and the fourth inductor 326 may comprise the inductance Lu, where the second inductor 318 and the fourth inductor 326 each have a value of Lu/2. Other values for the second inductor 318 and the fourth inductor 326 are possible, where the total inductance of the second inductor 318 and the fourth inductor 326 is Lu.

In an exemplary embodiment, the balanced side 340 also includes a capacitance (Cbp) 344 connected across the first inductor 319 and a capacitance (Cbm) 346 connected across the third inductor 319.

In an exemplary embodiment, the unbalanced side 310 may also include one or more capacitances. In an exemplary embodiment, the capacitances on the unbalanced side are shown in dotted line to indicate that they may be optional, that they may comprise parasitic capacitance, or that they may be physical devices. In an exemplary embodiment, the unbalanced side may comprise a capacitance (Cuct) 322, which may be connected between a center tap 329 and system ground. In an exemplary embodiment, the unbalanced side 310 may also include a capacitance (Cut 314) connected to one side of the second inductor 318, which is also the port 312, and system ground. In an exemplary embodiment, the unbalanced side 310 may also include a capacitance (Cum) 328 connected to one side of the fourth inductor 326, which is also a node 335, and system ground.

In an exemplary embodiment, either or both of the capacitance (Cut) 322 and the capacitance (Cum) 328 may be included in the balun circuit 300. In an exemplary embodiment, the capacitance (Cuct) may be implemented to improve performance of the balun circuit 300 in a particular frequency band, such as those frequencies that are in the D-band (110 GHz-170 GHz).

The transformer 316 and the transformer 324 each have a coupling factor (k). For example, a transformer with individual winding inductances, such as the transformer 316 and the transformer 324, has a mutual inductance, M, between the windings. The coupling factor, k, is a measure of that mutual coupling, where there is a coupling factor, k1, between the first inductor 319 and the third inductor 318; and there is a coupling factor, k2, between the second inductor 327 and the fourth inductor 326. The value of k1 and the value of k2 may be the same or different.

The transformers 316 and 324 are also referenced using what is referred to as a "dot convention." The dot convention is a type of polarity marking for transformer windings indicating the ends of the winding in relation to the other windings. It is used to indicate phase relationships in transformer schematic diagrams and it involves the placement of dots on the primary and secondary terminals. When the dots are placed next to the top ends of the primary and secondary windings, it indicates that the polarity of the instantaneous voltage across the primary winding will be the same as that across the secondary winding. This convention also dictates that the phase shift between the primary and secondary winding will be zero (in-phase), and the direction of the secondary current and primary current will be the same. However, if the dots are placed in reversed positions (e.g., up on primary, down on secondary or vice versa), it indicates that the primary and secondary current and voltages are 180° out of phase and the primary and secondary currents will be in opposite in direction to one another.

In an exemplary embodiment, the value of the inductance, also referred to as electrical length, of the first inductor 319 (Lbp) is different than the value of the inductance, or electrical length, of the second inductor 318 (Lu/2). Similarly, the value of the inductance, also referred to as electrical length, of the third inductor 327 (Lbm) is different than the value of the inductance, or electrical length, of the fourth inductor 326 (Lu/2). In this manner, the first inductor 319 (Lbp) and the second inductor 318 (Lu/2) are considered asymmetric inductors. Similarly, the third inductor 327 (Lbm) and the fourth inductor (Lu/2) 326 are considered asymmetric inductors. In an exemplary embodiment, the structure shown in FIG. 3 using the first inductor 319, the second inductor 318, the third inductor 327 and the fourth inductor 326 may be referred to as a dual asymmetric inductor architecture. The value of the inductance of the first inductor 319 (Lbp) may be different than the value of the inductance of the third inductor 327 (Lbm) or the value of the inductance of the first inductor 319 (Lbp) may be the same as the value of the inductance of the third inductor 327 (Lbm).

In an exemplary embodiment, the values of the first inductor 319 and the second inductor 318, the values of the third inductor 327 and the fourth inductor 326, and the values of the capacitances 314, 322, 328, 344 and 346 are such that the transformers 316 and 324 have a non-quarter wavelength electrical size, which reduces the overall physical size of the balun circuit 300. In an exemplary embodiment, a non-quarter wavelength electrical size may be characterized by the magnitude of the reactance of the first inductor 319, the second inductor 318, the third inductor 327, or the fourth inductor 326; or one or more of the capacitances 314, 322, 328, 344 or 346, i.e., $|j*\omega*L|$ or $|1/(j*\omega*C)|$, being smaller than $Z_o$, which refers to the characteristic impedance that would be used for a quarter wave transmission line to achieve the same or similar impedance transformation ratio.

In an exemplary embodiment, having the inductance Lu (inductors 318 and 326) on the unbalanced side 310, and the inductances Lbp and Lbm (inductors 319 and 327) on the balanced side 340 being unequal, along with selected values of the capacitances 314, 322, 328, 344 and 346, enables a smaller overall transformer size and a balun operation that can achieve a high impedance transformation ratio (ITR). The addition of one or more of the capacitances 314, 322, 328, 344 and 346 to the balun circuit 300 effectively increases the electrical length of the coupled inductors (the first inductor 319 and the second inductor 318 in the transformer 316 and the third inductor 327 and fourth inductor 326 in the transformer 324) such that a phase transfer function of the first transformer 316 and the second transformer 324 may be less than a quarter wavelength. Effectively increasing the electrical length of the coupled inductors (the first inductor 319 and the second inductor 318 in the transformer 316 and the third inductor 327 and fourth inductor 326 in the transformer 324) also enables an overall size reduction of the balun circuit 300 as described herein. Exemplary embodiments of the balun circuits described herein may provide 2:1, 5:1, 8:1, or other impedance transformation ratios.

When referring to an inductive transformer, the terms "primary" and "secondary" are sometimes used to indicate signal direction. For example, an "input" signal is typically provided to a primary side (or coil) of a transformer and an "output" signal is generally provided by a secondary side of a transformer. Applicant refers to the inductors of the transformers 316 and 324 herein generally using arbitrary non-directional references.

Notwithstanding the arbitrary non-directional references mentioned above, in some embodiments the transformers may be referred to using "primary" and "secondary" nomenclature. For example, if an input signal is provided to the ports 342 and 348 and an output signal is taken from the port 312, then the first inductor 319 and the third inductor 327 will be the "primary" side of respective transformers 316 and 324; and the second inductor 318 and the fourth inductor 326 will be the "secondary" side of respective transformers 316 and 324.

Similarly, if an input signal is provided to the port 312 and an output signal is taken from the ports 342 and 348, then the second inductor 318 and the fourth inductor 326 will be the "primary" side of respective transformers 316 and 324; and the first inductor 319 and the third inductor 327 will be the "secondary" side of respective transformers 316 and 324.

An architecture using asymmetrical transformers presents certain challenges when designing a balun circuit. Therefore, given an electromagnetic (EM) structure, i.e., a transformer, that was designed to operate within a particular frequency range, it is useful to determine an obtainable ITR range that could be achieved assuming a reasonable range of capacitance adjustability of the capacitances 314, 322, 328, 344 and 346.

For example, to develop a target impedance transformation ratio, initial values for the inductances Lu (inductors 318 and 326), the inductances Lbp and Lbm (inductors 319 and 327) and the capacitances 314, 322, 328, 344 and 346 are determined. This can be accomplished using, for example, a circuit simulation or design tool as known to those having ordinary skill in the art. This determination can lead to a physical design for the transformers 316 and 324 to determine a coupling factor, k. Using the resultant physical design for the transformers 316 and 324, the values for the capacitances 314, 322, 328, 344 and 346 can be determined to optimize gain and phase balance, bandwidth, input return loss, output return loss, etc. to maximize performance of the balun circuit.

It is possible that the extracted transformer design does not lead to a practically implementable set of capacitance values. It is also possible that the solution for a given ITR is suboptimal, i.e., there might exist another transformer candidate and capacitance set that achieves better performance Therefore, the process can be iterated with adjusted inductance and capacitance values until performance is optimized, leading to a physical design of the transformer structure and the set of capacitance values that achieve the desired ITR. Adjusting the ITR by selecting component values may compensate for impedance mismatch at either the port 312 or across ports 342 and 348.

In an exemplary embodiment, the value of the capacitance 344 (Cbp) and the value of the capacitance 346 (Cbm) can also be unequal to further adjust and refine the phase balance of the balun circuit 300 on the balanced side 340.

In an exemplary embodiment, the value of the capacitance 314 (Cut), the value of the capacitance 328 (Cum), and the value of the capacitance 322 (Cuct) can also be unequal to further refine the gain and phase balance on the unbalanced side 310.

In an exemplary embodiment, the capacitance 322 (Cuct) can improve performance in the D-band (110 GHz-170 GHz), allowing the primary inductors (e.g., the first inductor 319 and the third inductor 327 when a balanced signal is converted to an unbalanced signal) to better approximate a distributed transmission line (TL). The approximation of a distributed transmission line is achieved because adding the capacitance 322 Cuct between the second inductor 318 and the fourth inductor 326 creates a C-L-C-L-C structure on the unbalanced side 310 of the balun, instead of relying only on a C-L-C structure alone to provide a distributed transmission line.

In an exemplary embodiment, the values of the first inductor 319 and the second inductor 318, and the values of the third inductor 327 and the fourth inductor 326 and the values of the capacitances 314, 322, 328, 344 and 346 can be chosen to create a selected impedance transformation ratio (ITR), as described above. For example, the ITR can be selected for a receiver front end to match an optimum noise figure and provide a wide input power match bandwidth. For example, a real 2-port network will have a minimum noise figure, called NFmin, which occurs at a source impedance that is typically not the same as Zin* (aka Zin conjugate), which is the source impedance that results in maximum power transfer according to the maximum power transfer theorem. Selecting the ITR for a receiver front end to match an optimum noise figure and provide a wide input power match bandwidth can be achieved by having a consistent impedance transformation ratio over a wide bandwidth. This can be helpful to simultaneously balance the goals of low noise and high gain over a wide bandwidth. In a receive application, a selected ITR might be desired to allow wideband matching of a down conversion mixer (e.g., the mixer 286 in FIG. 2B) output impedance, which is usually higher than 50 Ohm, to the input impedance of a transimpedance amplifier, which is usually lower than 50 Ohm. An example of a transimpedance amplifier (TIA) may be the amplifier 262a and amplifier 262b in FIG. 2A or 2B. In some such examples, the balanced side of the balun is coupled to the mixer and the unbalanced side is coupled to the TIA. A transimpedance amplifier may also be located between the mixer 286 and the I/Q generator function 291. In some such examples, the balun circuit 300 may be disposed between an output of the transimpedance amplifier and the I/Q generator function 291. In some such examples, the balanced side of the balun is coupled to the mixer and the unbalanced side is coupled to the I/Q generator function.

In an exemplary embodiment, the balun circuit 300 provides an impedance agnostic interface at an RF or IF IO (input/output) so that despite unpredictable parasitics, gain is not compromised. An RF or IF IO (input/output) may generally refer to any one of an RF input, an RF output, an IF input, or an IF output. Exemplary embodiments of the balun circuit with adjustable impedance transformation ratio provide a high degree of flexibility in designing the impedance matching circuit that is placed at the any of the RF or IF interfaces to an RFIC.

In an exemplary embodiment, when used at an intermediate frequency (IF), the exemplary embodiments of the balun circuit with adjustable impedance transformation ratio can provide a very wide bandwidth, on the order of 10 GHz for a center frequency on the order of 15 GHz.

In an exemplary embodiment, the balun 300 can provide a selectable impedance in a compact footprint.

In an exemplary embodiment, the balun circuit 300 can provide a local oscillator (LO) signal with good balance to a mixer LO port which will improve LO feed through. For example, embodiments of the balun circuit with adjustable impedance transformation ratio may be implemented between the TX RF LO signal generator 277 and mixer 276 or between the RX RF LO signal generator 279 and mixer 286 of FIG. 2B. The balanced side of the balun circuit may be connected to the mixer 276 or mixer 286 and the unbalanced side of the balun circuit may be connected to the TX RF LO signal generator 277 or the RX RF LO signal generator 279

In FIG. 2A or FIG. 2B, an exemplary embodiment of the balun circuit could also be located between the TX LO signal generator 290 and the mixer 241a and another embodiment of the balun circuit may be located between the TX LO signal generator 290 and the mixer 241b. Two more instances of the balun circuit may also be located between the RX LO signal generator 280 and the mixer 261a and between the RX LO signal generator 280 and the mixer 261b. In these embodiments, the balanced side of the balun circuit would be connected to the mixers 261a and 261b and the unbalanced side of the balun circuit may be connected to the RX LO signal generator 280. In another exemplary embodiment, the balun circuit may be located inside the TX LO signal generator 290 and RX LO signal generator 280 to convert a single ended signal from the respective LO signal generator to a differential signal, and a differential quadrature hybrid (such as the I/Q generator function 291) may be used to generate differential I and Q LO signals in FIG. 2A.

Figure 4:
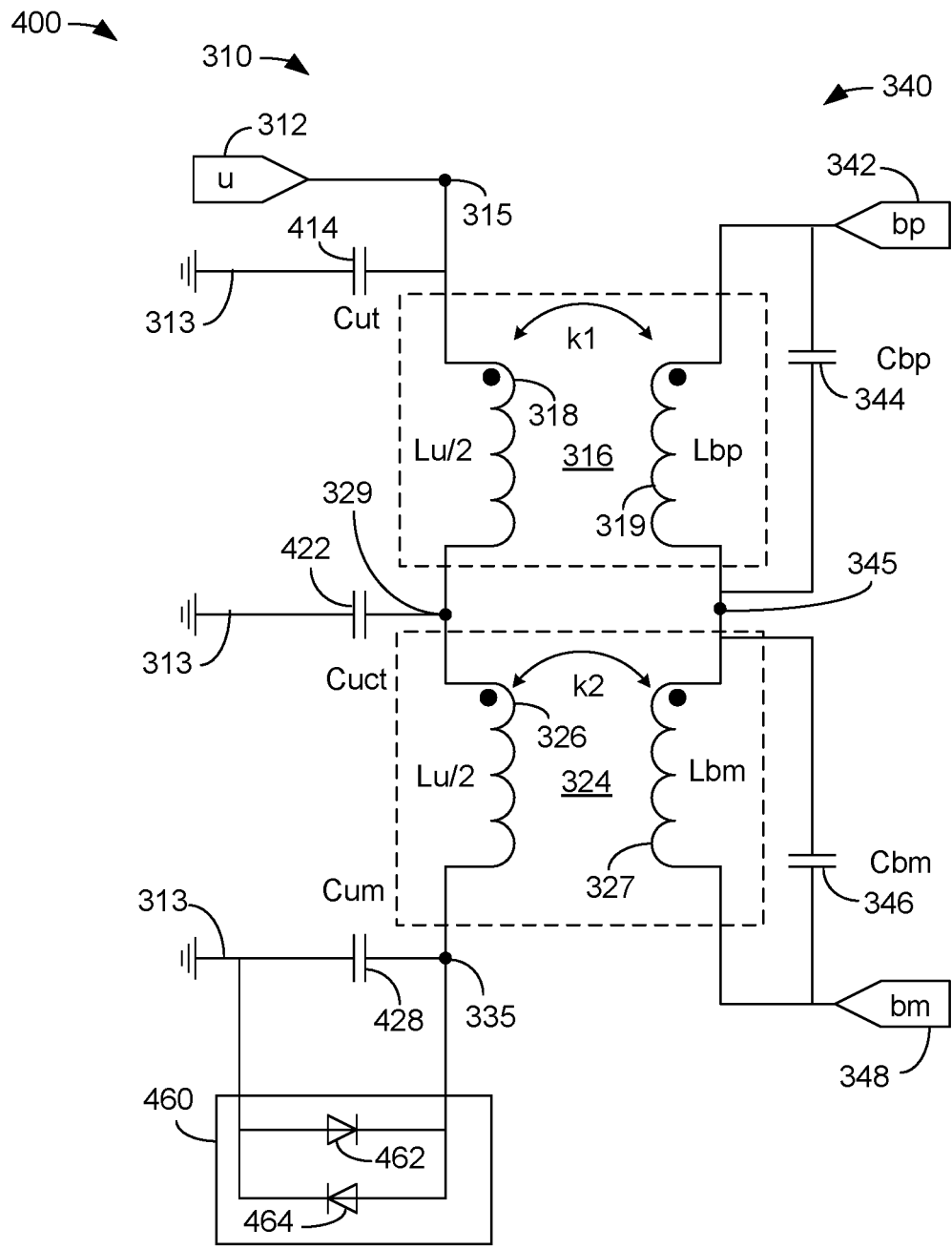
FIG. 4 is a block diagram of a balun circuit in accordance with an alternative exemplary embodiment of the disclosure.

FIG. 4 is a block diagram of a balun circuit 400 in accordance with an alternative exemplary embodiment of the disclosure. Elements identical to the elements in FIG. 3 are labeled the same. An element labeled 4XX in FIG. 4 is similar in function and/or configuration to an element labeled 3XX in FIG. 3. For example, the capacitances 414, 422 and 428 are similar to the capacitances 314, 322 and 328 in FIG. 3, but in some exemplary embodiments may be optional, may comprise parasitic capacitance, or may be physical devices as mentioned above. In an exemplary embodiment, the balun circuit 400 includes an electrostatic discharge (ESD) protection circuit 460. The ESD protection circuit 460 may include a diode 462 and a diode 464 and may be connected across the capacitance 428 (Cum).

In an exemplary embodiment, the ESD protection circuit 460 allows the balun circuit 400 to absorb electrostatic discharge applied to the port 312. In an exemplary embodiment, the total capacitance at the node 335 comprises the capacitance 428 (Cum) and the capacitance of the diodes 462 and 464. In this manner, the ESD protection circuit 460 increases the total capacitance connected to node 335, and provides additional ESD protection. When ESD diodes 462 and 464 are connected to node 335, capacitance 428 (Cum) may be reduced by the amount of capacitance added by ESD diodes 462 and 464.

The node 345 at the center tap of the balanced side 340 is optional and if implemented can provide a node to inject common mode bias voltages for a subsequent stage such as an amplifier when the ports 342 and 348 are connected to gate terminals of a differential amplifier.

Figure 5:
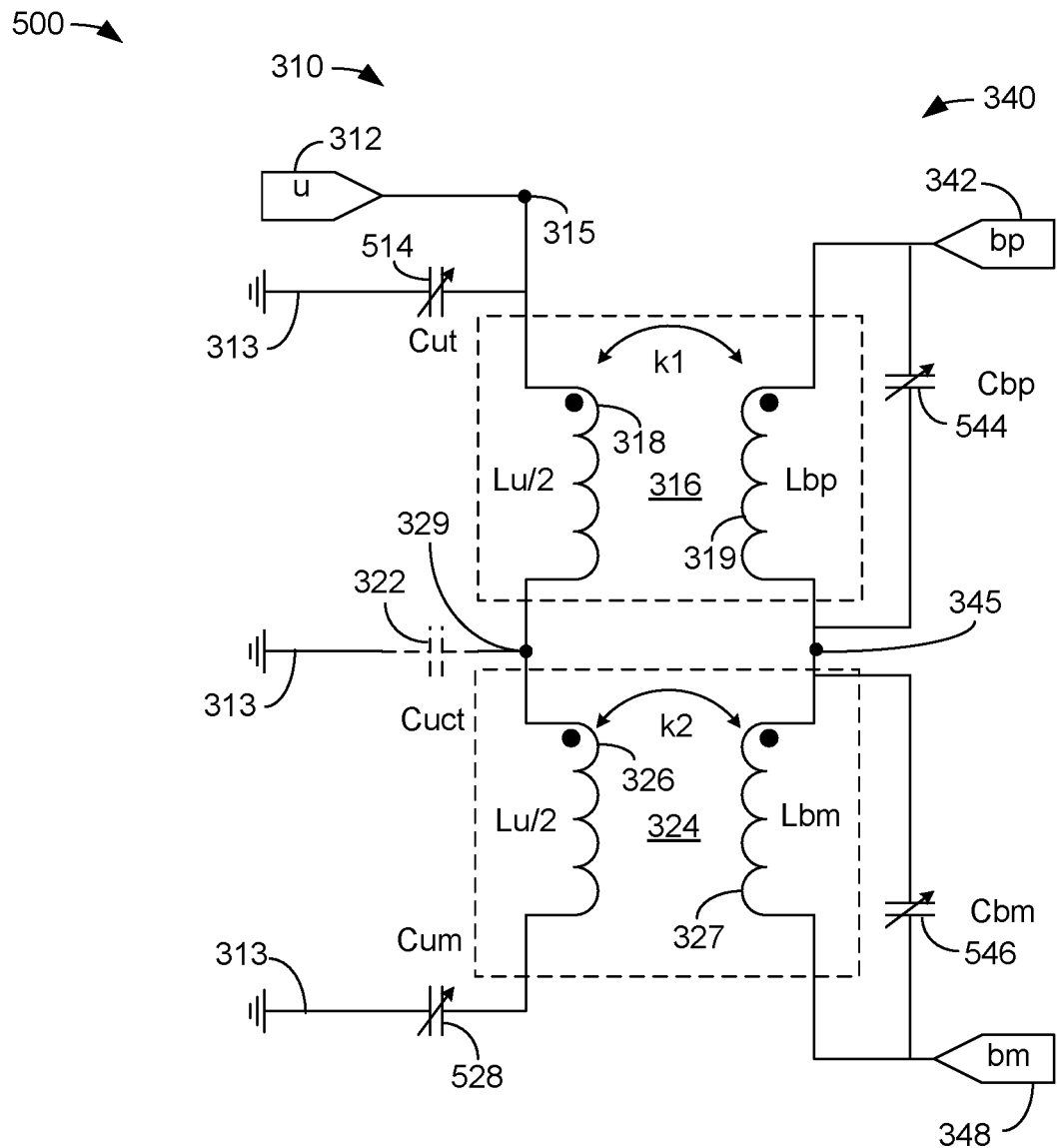
FIG. 5 is a block diagram of a balun circuit in accordance with an alternative exemplary embodiment of the disclosure.

FIG. 5 is a block diagram of a balun circuit in accordance with an alternative exemplary embodiment of the disclosure. In an exemplary embodiment, the balun circuit 500 includes variable capacitances for at least some of the capacitances associated with the balun circuit 500.

For example, the capacitances 514 (Cut), 528 (Cum), 544 (Cbp) and 546 (Cbm) may be implemented using adjustable capacitances. The adjustable capacitances 514 (Cut), 528 (Cum), 544 (Cbp) and 546 (Cbm) enable the balun circuit 500 to provide an adjustable ITR. In an exemplary embodiment, the respective values of the adjustable capacitances 514 (Cut), 528 (Cum), 544 (Cbp) and 546 (Cbm) may be set using a control signal from the data processor 210 (FIG. 2A, 2B) or another controller.

In an exemplary embodiment, the balun 500 can be used in a PA/antenna or a low noise amplifier (LNA)/antenna application as an antenna tuner.

For example, in a transmit application, the ITR of the balun circuit 500 can be selected to match the impedance of the power amplifier (PA) to an antenna, for example the PA 244 (FIG. 2A) to the antenna 248 or a PA in the phase shift circuitry 281 (FIG. 2B) to the antenna 248. The antenna impedance, or voltage standing wave ratio (VSWR), can vary which creates a variable load line for the power amplifier resulting in variations in the voltage swing experienced by the terminals of the transistor(s) that form the power amplifier. If the voltage swing is too large, the power amplifier can be damaged. In some exemplary embodiments the adjustable impedance provided by the balun circuit 500 can be tuned dynamically during device operation to protect the power amplifier by preventing the power amplifier load line from reaching a value that permits too large voltage swings at the terminals of the transistor(s) that form the power amplifier.

Figure 6:
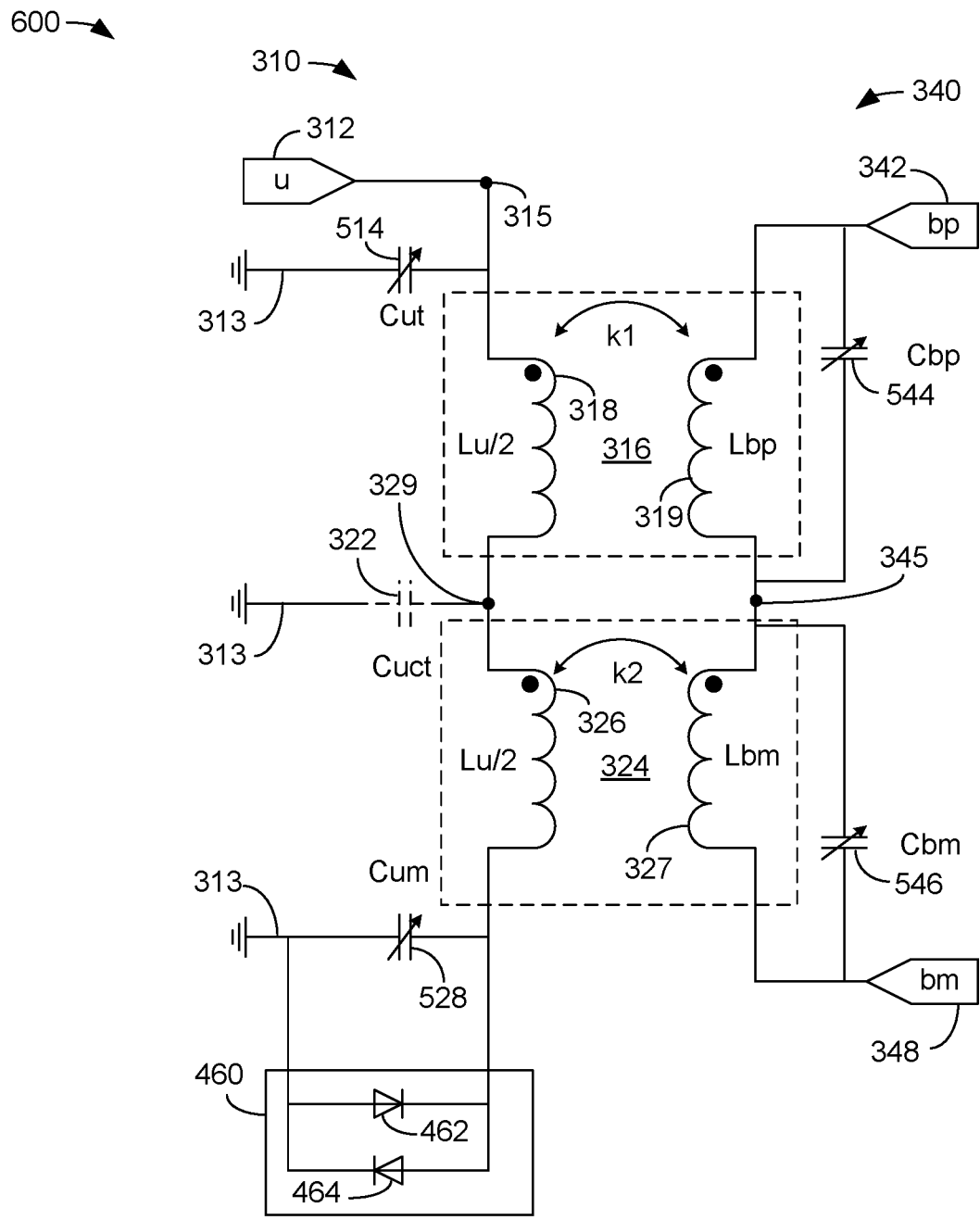
FIG. 6 is a block diagram of a balun circuit in accordance with an exemplary embodiment of the disclosure.

FIG. 6 is a block diagram of a balun circuit in accordance with an alternative exemplary embodiment of the disclosure. In an exemplary embodiment, the balun circuit 600 includes the ESD protection circuit 460 of FIG. 4 and includes the adjustable capacitances 514 (Cut), 528 (Cum), 544 (Cbp) and 546 (Cbm) of the balun circuit 500 of FIG. 5.

Figure 7:
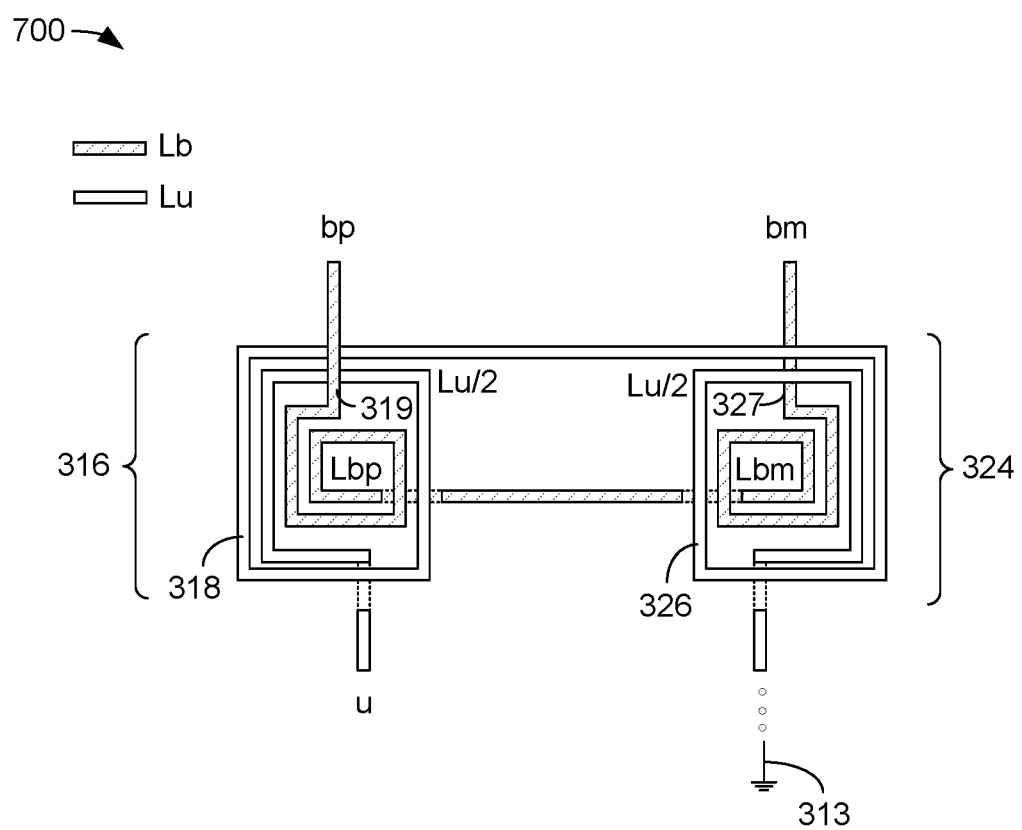
FIG. 7 is a schematic diagram showing an exemplary embodiment of the transformers of FIGS. 3, 4, 5 and 6.

FIG. 7 is a schematic diagram 700 showing an exemplary embodiment of the transformers 316 and 324 of FIGS. 3, 4, 5 and 6. The diagram 700 illustrates the asymmetry of the inductors in the transformers 316 and 324.

The transformer 316 has a winding that corresponds to the first inductor 319 and to the second inductor 318. The transformer 324 has a winding that corresponds to the third inductor 327 and to the fourth inductor 326. To maintain the asymmetry of the transformers 316 and 324, the first inductor 319 and the second inductor 318 have a different electrical length, corresponding to a different inductance value. Similarly, the third inductor 327 and the fourth inductor 326 have a different electrical length, corresponding to a different inductance value. For example, the value of the first inductor 319 may be Lbp and the value of the second inductor 318 may be Lu/2, where Lbp and Lu/2 are different. Similarly, the value of the third inductor 327 may be Lbm and the value of the fourth inductor 326 may be Lu/2, where Lbm and Lu/2 are different. Moreover, the value of the first inductor 319 (Lbp) may be different than the value of the third inductor 327 (Lbp). The asymmetry of the inductors 319 and 318, and the asymmetry of the inductors 327 and 326, along with the addition of capacitances 514, 322, 528, 544 and 546 from FIG. 6 provides an adjustable and selectable ITR and a small circuit area.

Figure 8:
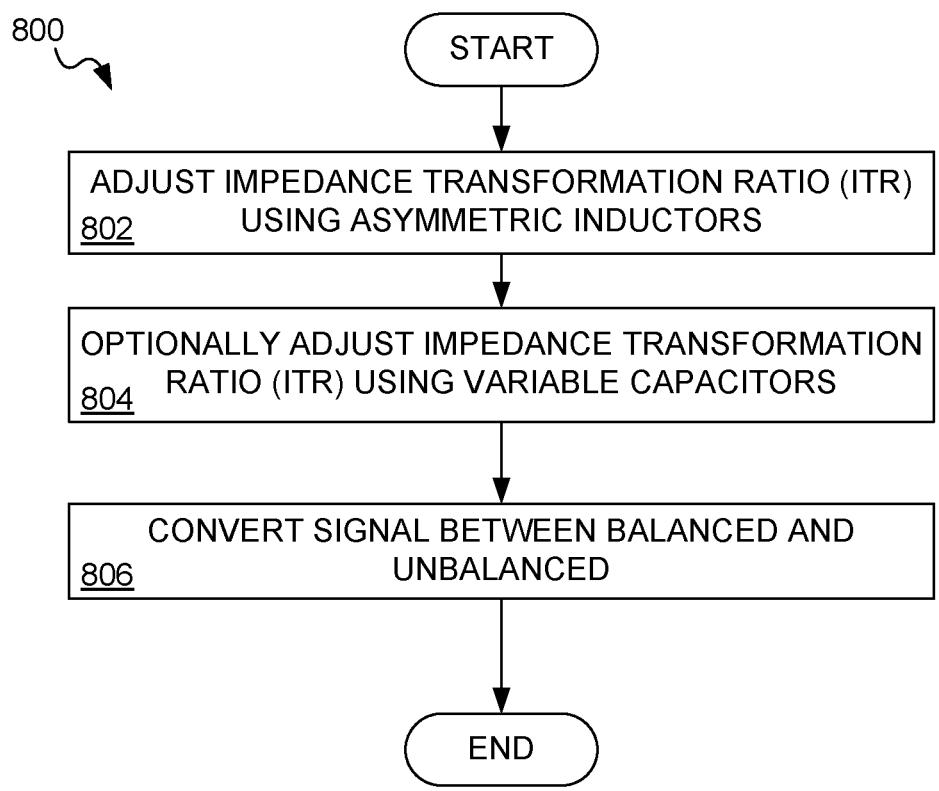
FIG. 8 is a flow chart describing an example of the operation of a method for signal conversion.

FIG. 8 is a flow chart 800 describing an example of the operation of a method for signal conversion. The blocks in the method 800 can be performed in or out of the order shown, and in some embodiments, can be performed at least in part in parallel.

In block 802, an impedance transformation ratio (ITR) of a balun circuit is adjusted by selecting inductor values. For example, the values of inductors 319, 318, 327 and 326 in a transformer 316 and a transformer 324 may be adjusted to provide a desired or selected ITR. In one example, the inductors 319 and 318 of a transformer 316, and the inductors 327 and 326 of a transformer 324 are selected to have different values such that an inductor (for example, inductor 319 or inductor 327) on a balanced side 340 of a balun circuit 300 and the inductor (for example, inductor 318 or inductor 326) on an unbalanced side 310 of a balun circuit 300 have asymmetric values.

In block 804, an impedance transformation ratio (ITR) of a balun circuit is optionally adjusted by selecting capacitance values. For example, the capacitances 344 (Cbp) and 346 (Cbm) associated with a balanced side 340 of a balun circuit 300 and the capacitances 314 (Cut), 322 (Cuct) and 328 (Cum) associated with an unbalanced side 310 of a balun circuit 300 are selected to provide a desired or selected ITR.

In block 806, a signal is converted between being an unbalanced signal and being a balanced signal. For example, a balun circuit of FIG. 3, 4, 5 or 6 may convert a signal from a balanced signal to an unbalanced signal; or may convert a signal from an unbalanced signal to a balanced signal.

Figure 9:
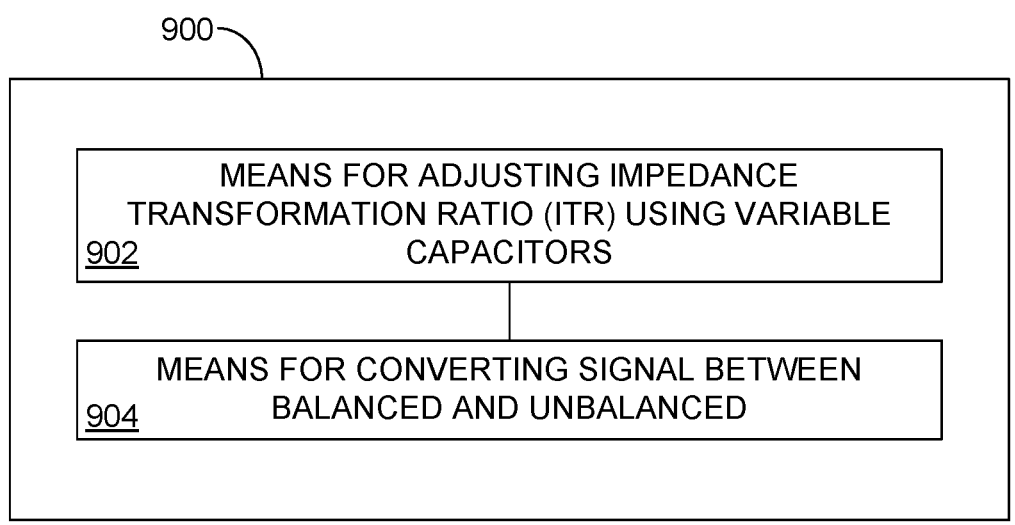
FIG. 9 is a functional block diagram of an apparatus for signal conversion.

FIG. 9 is a functional block diagram of an apparatus 900 for signal conversion.

The apparatus 900 comprises means 902 for adjusting an impedance transformation ratio (ITR) of a balun circuit by selecting capacitance values. In certain embodiments, the means 902 for adjusting an impedance transformation ratio (ITR) of a balun circuit by selecting capacitance values can be configured to perform one or more of the functions described in operation block 804 of method 800 (FIG. 8). In an exemplary embodiment, the means 902 for adjusting an impedance transformation ratio (ITR) of a balun circuit by selecting capacitance values may comprise the data processor 210, for example which may be configured to select the values of the capacitances 344 (Cbp) and 346 (Cbm) associated with a balanced side 340 of a balun circuit 300 and the capacitances 314 (Cut), 322 (Cuct) and 328 (Cum) associated with an unbalanced side 310 of a balun circuit 300 to provide a desired or selected ITR, or dynamically adjusting the values of the capacitances 514 (Cut), 528 (Cum), 544 (Cbp) and 546 (Cbm).

The apparatus 900 may also comprise means 904 for converting a signal between balanced and unbalanced. In certain embodiments, the means 904 for converting a signal between balanced and unbalanced can be configured to perform one or more of the functions described in operation block 806 of method 800 (FIG. 8). In an exemplary embodiment, the means 904 for converting a signal between balanced and unbalanced may comprise a balun circuit of FIG. 3, 4, 5 or 6 converting a signal from a balanced signal to an unbalanced signal; or converting a signal from an unbalanced signal to a balanced signal.

Implementation examples are described in the following numbered clauses:

1. A balun circuit, comprising a first transformer comprising a first inductor and a second inductor, the first inductor having an electrical value different than the second inductor; a second transformer comprising a third inductor and a fourth inductor, the third inductor having an electrical value different than the fourth inductor, the first inductor connected to a positive terminal of a balanced port, the third inductor connected to a negative terminal of the balanced port, the second inductor connected to an unbalanced port and the fourth inductor connected to a node; a first capacitance connected across the first inductor; and a second capacitance connected across the third inductor.

2. The balun circuit of clause 1, further comprising a third capacitance connected between the unbalanced port and system ground; a fourth capacitance connected between the node and system ground; a first center tap between the second inductor and the fourth inductor; and a fifth capacitance connected between the first center tap and system ground.

3. The balun circuit of clause 2, wherein the first through fourth capacitances are adjustable.

4. The balun circuit of any of clauses 2 through 3, wherein the first and second transformers provide an impedance transformation and one or more of the first capacitance, the second capacitance, the third capacitance, the fourth capacitance, and the fifth capacitance are configured to increase an electrical length of the first inductor, second inductor, third inductor and fourth inductor such that a phase transfer function of the first and second transformers is less than a quarter wavelength.

5. The balun circuit of any of clauses 2 through 4, further comprising diodes coupled to the fourth inductor to provide electrostatic discharge (ESD) protection.

6. The balun circuit of any of clauses 2 through 5, wherein the balun circuit provides an adjustable impedance transformation ratio.

7. The balun circuit of any of clauses 2 through 6, wherein the balun circuit provides a variable impedance transformation ratio that can be adjusted during calibration.

8. The balun circuit of any of clauses 2 through 7, wherein the balun circuit provides a tunable impedance transformation ratio that can be adjusted during operation.

9. The balun circuit of any of clauses 2 through 8, further comprising a second center tap between the first inductor and the third inductor, the second center tap configured to accept a common mode bias voltage.

10. The balun circuit of any of clauses 2 through 9, further comprising diodes coupled to the fourth inductor to provide electrostatic discharge (ESD) protection.

11. A method for signal conversion, comprising: adjusting the impedance transformation ratio (ITR) of a balun circuit by selecting capacitance values, the balun circuit comprising two asymmetric transformers, and the capacitance values being for capacitors coupled to a balanced node or an unbalanced node of the balun circuit; and converting a signal between balanced and unbalanced using the balun circuit.

12. The method of clause 11, wherein the selecting capacitance values comprises selecting variable capacitance values.

13. The method of any of clauses 11 through 12, wherein the selecting capacitance values comprises selecting tunable capacitance values.

14. The method of any of clauses 11 through 13, wherein a selected impedance transformation ratio (ITR) provides a non-quarter wavelength impedance transformation.

15. The method of any of clauses 11 through 14, further comprising providing electrostatic discharge (ESD) protection.

16. The method of any of clauses 11 through 15, further comprising providing a variable impedance transformation ratio that can be adjusted during calibration.

17. The method of any of clauses 11 through 16, further comprising providing a tunable impedance transformation ratio that can be adjusted during operation.

18. The method of any of clauses 11 through 17, further comprising providing a common mode bias voltage to a node on a balanced side of the balun circuit coupling the two transformers together.

19. A balun circuit, comprising: a pair of asymmetric transformers coupled together, wherein inductors on an unbalanced side of the asymmetric transformers have approximately equal inductance.

20. The balun circuit of clause 19, further comprising a pair of capacitors respectively coupled across inductors on a balanced side of the asymmetric transformers.

21. The balun circuit of any of clauses 19 through 20, further comprising a capacitor coupled to a node between the asymmetric transformers on the unbalanced side and ground.

22. The balun circuit of any of clauses 19 through 21, wherein the pair of asymmetric transformers, a pair of capacitors respectively coupled across inductors on a balanced side of the asymmetric transformers, and the capacitor coupled to a node between the asymmetric transformers on the unbalanced side and ground are configured to provide an adjustable impedance transformation ratio.

23. The balun circuit of any of clauses 19 through 22, further comprising diodes coupled to the unbalanced side of the asymmetric transformers to provide electrostatic discharge (ESD) protection.

24. The balun circuit of any of clauses 19 through 23, wherein the balun circuit provides a variable impedance transformation ratio that can be adjusted during calibration.

25. The balun circuit of any of clauses 19 through 24, wherein the balun circuit provides a tunable impedance transformation ratio that can be adjusted during operation.

26. The balun circuit of any of clauses 19 through 25, further comprising a node between inductors on a balanced side of the asymmetric transformers, the node configured to accept a common mode bias voltage.

The circuit architecture described herein described herein may be implemented on one or more ICs, analog ICs, RFICs, mixed-signal ICs, ASICs, printed circuit boards (PCBs), electronic devices, etc. The circuit architecture described herein may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the circuit described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

Although selected aspects have been illustrated and described in detail, it will be understood that various substitutions and alterations may be made therein without departing from the spirit and scope of the present invention, as defined by the following claims.

What is claimed is:

1. A balun circuit, comprising:
    a first transformer comprising a first inductor and a second inductor, the first inductor having an electrical value different than the second inductor;
    a second transformer comprising a third inductor and a fourth inductor, the third inductor having an electrical value different than the fourth inductor, the first inductor connected to a positive terminal of a balanced port, the third inductor connected to a negative terminal of the balanced port, the second inductor connected to an unbalanced port and the fourth inductor connected to a node;
    a first capacitance connected across the first inductor;
    a second capacitance connected across the third inductor;
    a third capacitance connected between the unbalanced port and system ground;
    a fourth capacitance connected between the node and system ground;
    a first center tap between the second inductor and the fourth inductor; and
    a fifth capacitance connected between the first center tap and system ground.

2. The balun circuit of claim 1, further comprising a second center tap between the first inductor and the third inductor, the second center tap configured to accept a common mode bias voltage.

3. The balun circuit of claim 1, wherein the first through fourth capacitances are adjustable.

4. The balun circuit of claim 3, further comprising diodes coupled to the fourth inductor to provide electrostatic discharge (ESD) protection.

5. The balun circuit of claim 1, further comprising diodes coupled to the fourth inductor to provide electrostatic discharge (ESD) protection.

6. The balun circuit of claim 1, wherein the balun circuit provides an adjustable impedance transformation ratio.

7. The balun circuit of claim 6, wherein the balun circuit provides a variable impedance transformation ratio that can be adjusted during calibration.

8. The balun circuit of claim 6, wherein the balun circuit provides a tunable impedance transformation ratio that can be adjusted during operation.

9. The balun circuit of claim 1, wherein the first and second transformers provide an impedance transformation and one or more of the first capacitance, the second capacitance, the third capacitance, the fourth capacitance, and the fifth capacitance are configured to increase an electrical length of the first inductor, second inductor, third inductor and fourth inductor such that a phase transfer function of the first and second transformers is less than a quarter wavelength.

10. A method for signal conversion, comprising:
    adjusting the impedance transformation ratio (ITR) of a balun circuit by selecting capacitance values, the balun circuit comprising two asymmetric transformers, and the capacitance values being for capacitors coupled to a balanced node or an unbalanced node of the balun circuit; and converting a signal between balanced and unbalanced using the balun circuit, wherein a selected impedance transformation ratio (ITR) provides a non-quarter wavelength impedance transformation.

11. The method of claim 10, further comprising providing a common mode bias voltage to a node on a balanced side of the balun circuit coupling the two asymmetric transformers together.

12. The method of claim 10, wherein the selecting capacitance values comprises selecting variable capacitance values.

13. The method of claim 10, wherein the selecting capacitance values comprises selecting tunable capacitance values.

14. The method of claim 10, further comprising providing a tunable impedance transformation ratio that can be adjusted during operation.

15. The method of claim 10, further comprising providing electrostatic discharge (ESD) protection.

16. The method of claim 10, further comprising providing a variable impedance transformation ratio that can be adjusted during calibration.

17. A balun circuit, comprising:

a pair of asymmetric transformers coupled together; and a pair of capacitors respectively directly connected across inductors on a balanced side of the asymmetric transformers, wherein inductors on an unbalanced side of the pair of asymmetric transformers have approximately equal inductance.

18. The balun circuit of claim 17, further comprising another capacitor coupled to a node between the pair of asymmetric transformers on the unbalanced side and ground.

19. The balun circuit of claim 18, wherein the pair of asymmetric transformers, the pair of capacitors respectively directly connected across the inductors on the balanced side of the pair of asymmetric transformers, and the another capacitor coupled to a node between the pair of asymmetric transformers on the unbalanced side and ground are configured to provide an adjustable impedance transformation ratio.

20. The balun circuit of claim 17, further comprising diodes coupled to the unbalanced side of the pair of asymmetric transformers to provide electrostatic discharge (ESD) protection.

21. The balun circuit of claim 17, wherein the balun circuit provides a variable impedance transformation ratio that can be adjusted during calibration.

22. The balun circuit of claim 17, wherein the balun circuit provides a tunable impedance transformation ratio that can be adjusted during operation.

23. The balun circuit of claim 17, further comprising a node between the inductors on the balanced side of the pair of asymmetric transformers, the node configured to accept a common mode bias voltage.

* * * * *